United States Patent
Wang et al.

(10) Patent No.: US 12,426,403 B2
(45) Date of Patent: Sep. 23, 2025

(54) SOLAR CELL AND METHOD FOR PREPARING SAME, PHOTOVOLTAIC MODULE AND POWER CONSUMING DEVICE

(71) Applicant: CONTEMPORARY AMPEREX TECHNOLOGY (HONG KONG) LIMITED, Hong Kong (CN)

(72) Inventors: Yanfen Wang, Fujian (CN); Shuojian Su, Fujian (CN); Yandong Wang, Fujian (CN); Weile Lin, Fujian (CN); Hanfang Li, Fujian (CN); Xiangling Lin, Fujian (CN); Changmao Wang, Fujian (CN); Guodong Chen, Fujian (CN); Yongsheng Guo, Fujian (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/207,690

(22) Filed: Jun. 9, 2023

(65) Prior Publication Data
US 2023/0317862 A1      Oct. 5, 2023

Related U.S. Application Data

(63) Continuation of application No. PCT/CN2022/073519, filed on Jan. 24, 2022.

(51) Int. Cl.
*H10F 19/90*       (2025.01)
*H10F 71/00*       (2025.01)
(Continued)

(52) U.S. Cl.
CPC .......... *H10F 77/935* (2025.01); *H10F 19/90* (2025.01); *H10F 71/00* (2025.01); *H10F 77/211* (2025.01); *B60L 8/003* (2013.01)

(58) Field of Classification Search
CPC ....... H01L 31/02008; H01L 31/022425; H01L 31/05; H01L 31/0465; H10K 39/12;
(Continued)

(56) References Cited

U.S. PATENT DOCUMENTS

2014/0076392 A1*  3/2014  Lin ................... H01L 31/03923
                                                  438/98
2014/0332078 A1   11/2014  Guo et al.
(Continued)

FOREIGN PATENT DOCUMENTS

CN       103053033 A       4/2013
CN       106229327 A      12/2016
(Continued)

OTHER PUBLICATIONS

Chen (Effect of BCP buffer layer on eliminating charge accumulation for high performance of inverted perovskite solar cells), RSC Adv., 2017, 7, 35819 (Year: 2017).*

(Continued)

*Primary Examiner* — Angelo Trivisonno
(74) *Attorney, Agent, or Firm* — XSENSUS LLP

(57) ABSTRACT

The present application relates to a solar cell and a method for preparing the same, a photovoltaic module, and a power consuming device. The solar cell may have a plurality of sub-cells, each of the plurality of sub-cells including a first electrode layer, a photovoltaic conversion module, and a second electrode layer that may be sequentially stacked along a thickness direction of the sub-cell, the second electrode layer including a main body portion and a connection portion electrically connected to the main body portion, and the connection portion of one of the plurality of sub-cells being configured to be electrically connected to the first electrode layer of another sub-cell, such that the plurality of sub-cells may be electrically connected, where a
(Continued)

thickness of the main body portion may be greater than that of the connection portion.

7 Claims, 6 Drawing Sheets

(51) Int. Cl.
*H10F 77/00* (2025.01)
*H10F 77/20* (2025.01)
*B60L 8/00* (2006.01)

(58) Field of Classification Search
CPC ......... H10K 30/81; H10F 19/90; H10F 71/00; H10F 77/935; H10F 77/211; H10F 19/35
See application file for complete search history.

(56) References Cited

U.S. PATENT DOCUMENTS

| | | | |
|---|---|---|---|
| 2017/0110616 A1 | 4/2017 | Dissanayake et al. | |
| 2017/0271539 A1* | 9/2017 | Mwaura | H10F 19/33 |
| 2020/0403108 A1* | 12/2020 | Amano | H10K 39/10 |

FOREIGN PATENT DOCUMENTS

| | | |
|---|---|---|
| CN | 107910445 B | 8/2019 |
| CN | 110534651 A | 12/2019 |
| CN | 112701176 A | 4/2021 |
| CN | 112820788 A | 5/2021 |
| CN | 213366623 U | 6/2021 |
| CN | 213519994 U | 6/2021 |
| JP | 2019-067912 A | 4/2019 |
| JP | 2021-136434 A | 9/2021 |
| WO | 2020/188777 A1 | 9/2020 |
| WO | 2020188778 A1 | 9/2020 |

OTHER PUBLICATIONS

Bush, Kevin A. et al., "23.6%-Efficient Monolithic Perovskite/silicon Tandem Solar Cells with Improved Stability." Nature Energy vol. 2, No. 4, pp. 1-27, Feb. 17, 2017, Macmillan Publishers Limited, part of Springer Nature.
Office Action issued May 24, 2024 in Korean Patent Application No. 10-2023-7018725 with English translation.
International Search Report mailed on Oct. 22, 2022, received for PCT Application PCT/CN2022/073519, filed on Jan. 24, 2022, 6 pages including English Translation.
Extended European Search Report issued Feb. 1, 2024 in European Patent Application No. 22902461.7.
Janardan Dagar, et al., "Stability Assessment of p-i-n Perovskite Photovoltaic Mini-Modules Utilizing Different Top Metal Electrodes", Micromachines 2021, vol. 12, No. 4, 423, Apr. 13, 2021.
Office Action issued Mar. 12, 2024 in Japanese Patent Application No. 2023-533993 with English translation thereof.
Office Action issued Jan. 8, 2025 in Japanese Patent Application No. 2023-533993 with English translation thereof.

* cited by examiner

SOLAR CELL AND METHOD FOR PREPARING SAME, PHOTOVOLTAIC MODULE AND POWER CONSUMING DEVICE

CROSS-REFERENCE TO RELATED APPLICATION

The present application is a continuation of International Application No. PCT/CN2022/073519, filed Jan. 24, 2022, which is incorporated herein by reference in its entirety.

TECHNICAL FIELD

The present application relates to the field of battery production technologies, and in particular, to a solar cell and a method for preparing the same, a photovoltaic module, and a power consuming device.

BACKGROUND ART

Solar cells are photovoltaic conversion devices that directly convert light energy into electrical energy, and they have an excellent photovoltaic property and is simple in the preparation method, bringing new space and hope to photovoltaic power generation.

In a production process of solar cells, how to further improve the photovoltaic conversion efficiency of the solar cells is an urgent problem to be solved.

SUMMARY OF THE DISCLOSURE

The present application has been made in view of the above problems, and an objective of the present application is to provide a solar cell and a method for preparing the same, a photovoltaic module, and a power consuming device, so as to improve the photovoltaic conversion efficiency of the solar cell.

To achieve the above objective, an embodiment in a first aspect of the present application provides a solar cell, and the solar cell has a plurality of sub-cells, each of the plurality of sub-cells including a first electrode layer, a photovoltaic conversion module, and a second electrode layer that are sequentially stacked along a thickness direction of the sub-cell, the second electrode layer including a main body portion and a connection portion electrically connected to the main body portion, and the connection portion of one of the plurality of sub-cells being configured to be electrically connected to the first electrode layer of another sub-cell, such that the plurality of sub-cells are electrically connected, where a thickness of the main body portion is greater than that of the connection portion.

Therefore, in the embodiment of the present application, when the structure of the sub-cell is formed, the thickness of the main body portion is set to be greater than that of the connection portion, so that the photovoltaic conversion module can be protected, a risk of intrusion of external water vapor and oxygen into the photovoltaic conversion module can be reduced, and performance of the photovoltaic conversion module can be ensured, thereby ensuring photovoltaic conversion efficiency of the solar cell. In addition, when a second hollowed-out portion is formed through scribing, part of the main body portion can have a good heat conduction effect, a heat island at the edge of the structure of the second hollowed-out portion formed through scribing is relatively small, and the structure of the sub-cell is relatively stable, so that the photovoltaic conversion efficiency of the solar cell can be improved.

In any implementation, a ratio of the thickness of the main body portion to that of the connection portion is denoted by A, and $1<A\leq20$; optionally, $1<A\leq10$. When A satisfies the above range, the main body portion may not only have a good protective effect on the photovoltaic conversion module, but also improve the photovoltaic conversion efficiency of the solar cell.

In any implementation, the main body portions are made of the same material; and optionally, the material of the main body portion includes aurum (Au), argentum (Ag), cuprum (Cu), aluminum (Al), a transparent conductive oxide (TCO), or carbon. There is substantially no interface inside the main body portion, so that the structural stability of the main body portion as a whole can be improved.

In any implementation, the main body portion includes a first part and a second part, the second part is located on one side of the first part that faces away from the first electrode layer, and the first part and the second part are made of different materials; and optionally, the material of each of the first part and the second part is independently selected from aurum (Au), argentum (Ag), cuprum (Cu), aluminum (Al), a transparent conductive oxide (TCO), or carbon. The first part may protect the photovoltaic conversion module well, and have a good heat conduction effect in the scribing process. The second part may have a good electric conduction effect, which is conducive to transporting electrons.

In any implementation, the sub-cell includes a barrier layer for blocking transport of first charges, and the barrier layer is disposed between the photovoltaic conversion module and the main body portion; and optionally, the material of the barrier layer includes at least one of a block copolymer (BCP), lithium fluoride (LiF), and stannic oxide ($SnO_2$). The barrier layer can block transport of electron holes at the interface of the photovoltaic conversion module, so that transport efficiency of electrons from the photovoltaic conversion module to the second electrode layer is improved, a risk of recombination of electrons and electron holes at the interface of the photovoltaic conversion module can be reduced, and the transport efficiency of electrons is further improved, thereby improving the photoelectron conversion efficiency of the solar cell.

In any implementation, a ratio of a weight of the barrier layer to that of the main body portion is denoted by B, and $0.001\leq B\leq0.2$; and optionally, $0.005\leq B\leq0.1$. When B satisfies the above range, on a basis that the barrier layer has a good effect of blocking electron holes, the main body portion may have a good protective effect on the barrier layer, thereby improving the photovoltaic conversion efficiency of the solar cell.

In any implementation, a ratio of a thickness of the barrier layer to that of the main body portion is denoted by C, and $0.005\leq C\leq0.2$; and optionally, $0.01\leq C\leq0.1$. When C satisfies the above range, on a basis that the barrier layer has a good effect of blocking electron holes, the main body portion may have a good protective effect on the barrier layer, thereby improving the photovoltaic conversion efficiency of the solar cell.

In any implementation, the photovoltaic conversion module includes a first charge transport layer, a photovoltaic conversion layer, and a second charge transport layer that are sequentially stacked along the thickness direction of the sub-cell, and the first charge transport layer is located between the first electrode layer and the photovoltaic conversion layer.

The material of the first charge transport layer includes at least one of poly[bis(4-phenyl)(2,4,6-trimethylphenyl) amine (PTAA), poly(3,4-ethylenedioxythiophene) (PEDOT), nickel oxide (NiOx), CuI, and $Cu_2O$. The first charge transport layer is disposed between the first electrode layer and the photovoltaic conversion layer, so that a good ohmic contact can be formed, and electron holes can be effectively transported, thereby reducing recombination of carriers at the interface, and improving the photovoltaic conversion efficiency.

The material of the photovoltaic conversion layer conforms to the $ABX_3$ crystal structure, where A includes at least one of methylammonium (MA), formamide (FA), and cesium (Cs), B includes at least one of plumbum (Pb), stannum (Sn), and cuprum (Cu), and X includes at least one of bromine (Br), chlorine (Cl), and iodine (I). The photovoltaic conversion layer may absorb photons and convert light into electrons and electron holes, and respectively transport electrons and electron holes to the first charge transport layer and the second charge transport layer under the action of a built-in electric field.

The material of the second charge transport layer includes at least one of C60, stannic oxide ($SnO_2$), a fullerene derivative (PCBM), and titanium oxide ($TiO_2$). The second charge transport layer is disposed between the photovoltaic conversion layer and the second electrode layer, so that the energy level potential barrier between the photovoltaic conversion layer and the second electrode layer can be reduced, which is conducive to transporting electrons and improving electron transport efficiency. In addition, the second charge transport layer is conducive to transporting electrons, blocking electron holes, and reducing a risk of recombination of carriers at the interface.

In any implementation, the material of the first electrode layer includes aurum (Au), argentum (Ag), cuprum (Cu), aluminum (Al), a transparent conductive oxide (TCO), or carbon. The first electrode layer made of the above material has better electrical conductivity, and is conducive to transporting electron holes.

A second aspect of the present application provides a photovoltaic module, including a plurality of solar cells according to the embodiment in the first aspect of the present application.

A third aspect of the present application provides a power consuming device, including a plurality of photovoltaic modules according to the embodiment in the second aspect of the present application.

A fourth aspect of the present application provides a method for preparing a solar cell, including: providing a substrate; forming a bottom electrode on one side of the substrate, the bottom electrode including a plurality of first electrode layers disposed at intervals, such that the solar cell is divided into a plurality of sub-cells; forming a photovoltaic conversion module on a surface of each of the plurality of first electrode layers that faces away from the substrate; and forming a second electrode layer on a surface of the photovoltaic conversion module that faces away from the substrate, the second electrode layer including a main body portion and a connection portion electrically connected to the main body portion, and the connection portion of one of the plurality of sub-cells being configured to be electrically connected to the first electrode layer of another sub-cell, such that the plurality of sub-cells are electrically connected, where a thickness of the main body portion is greater than that of the connection portion.

In any implementation, the step of forming a second electrode layer on a surface of the photovoltaic conversion module that faces away from the substrate includes: forming a first part on the surface of the photovoltaic conversion module that faces away from the substrate; sequentially removing a partial region of the first part and a partial region of the photovoltaic conversion module along a thickness direction of the sub-cell, to form a hollowed-out region; and forming a second part on a surface of the first part that faces away from the substrate, and forming a connection portion in the hollowed-out region, where the second part and the first part are made of different materials.

In any implementation, a barrier layer is provided between the photovoltaic conversion module and the second electrode layer, and the barrier layer is configured to block transport of electron holes.

BRIEF DESCRIPTION OF THE DRAWINGS

Features, advantages, and technical effects of exemplary embodiments of the present application will be described below with reference to accompanying drawings.

Figure 1:
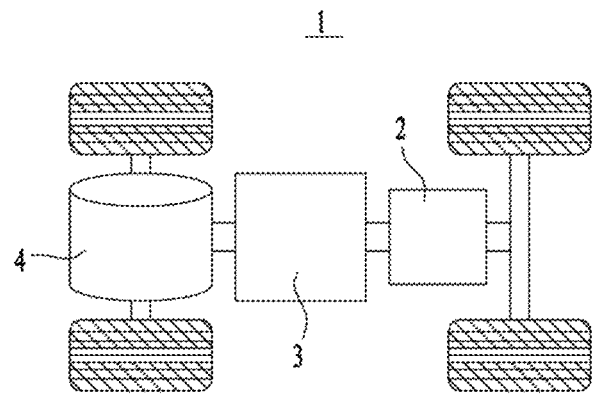
FIG. 1 is a schematic structural diagram of a vehicle provided in some embodiments of the present application.

The accompanying drawings may not be drawn to the actual scale.

Reference signs in the drawings are as follows:
X: thickness direction; P1: first hollowed-out portion; P2: second hollowed-out portion; P3: third hollowed-out portion;
1: vehicle; 2: photovoltaic module; 3: controller; 4: motor;
5: solar cell;
50: substrate;
51: first electrode layer;
52: photovoltaic conversion module; 521: first charge transport layer; 522: photovoltaic conversion layer; 523: second charge transport layer;
53: second electrode layer; 531: main body portion; 5311: first part; 5312: second part;
532: connection portion;
54: barrier layer;
6: sub-cell.

DETAILED DESCRIPTION OF EMBODIMENTS

The implementations of the present application will be further described in detail below in conjunction with the accompanying drawings and embodiments. The following detailed description of the embodiments and the accompanying drawings are used to illustrate the principle of the present application by way of example but should not be used to limit the scope of the present application. That is, the present application is not limited to the described embodiments.

In the description of the present application, it should be noted that "a plurality of" means two or more, unless otherwise specified. The orientation or position relationship indicated by the terms "upper", "lower", "left", "right", "inner", "outer", etc. is only for the convenience of describing the present application and simplifying the description, rather than indicating or implying that the device or element referred to must have a particular orientation or be constructed and operated in a particular orientation, and therefore should not be construed as a limitation on the present application. In addition, the terms "first", "second", "third", etc. are used for descriptive purposes only, and should not be construed as indicating or implying the relative importance. The term "perpendicular" does not mean being perpendicular in the strict sense, but within an allowable range of errors. The term "parallel" does not mean being parallel in the strict sense, but within an allowable range of errors.

The orientation terms in the following description all indicate directions shown in the drawings, but do not limit the specific structure in the present application. In the description of the present application, it should also be noted that the terms "mounting", "connecting", and "connection" should be interpreted in the broad sense unless explicitly defined and limited otherwise. For example, the terms may mean a fixed connection, a detachable connection, or an integral connection, or may mean a direct connection, or an indirect connection by means of an intermediate medium. For those of ordinary skill in the art, the specific meanings of the terms mentioned above in the present application can be construed according to specific circumstances.

In the embodiments of the present application, a solar cell is a photovoltaic conversion device that directly converts light energy into electrical energy on a theoretical basis of the photovoltaic effect. A solar cell includes a photovoltaic conversion module for photovoltaic conversion, a transport layer, and an electrode layer. Due to the use of different materials for the photovoltaic conversion module, the transport layer, and the electrode layer, and a difference in quasi-fermi levels of the different materials, a built-in electric field is formed inside the photovoltaic conversion device. As a light absorption material for the solar cell, the photovoltaic conversion module absorbs photons to generate electron-electron hole pairs, which can be split into free carriers, then the generated free carriers drift in the opposite directions under the action of the built-in electric field, the electrons move to the negative electrode, the electron holes move to the positive electrode, and the electrons and electron holes are respectively transported by different transport layers and then collected by the electrode layer, thereby forming a potential difference between the positive electrode and negative electrode, generating a current, and completing the entire photovoltaic conversion process.

Performance of a solar cell may be reflected by a short-circuit current density, an open-circuit voltage, a fill factor, photovoltaic conversion efficiency, etc.

The short-circuit current density is a current density obtained when the solar cell is in a short-circuit state, that is, a voltage across both terminals of the solar cell is zero. A short-circuit current is generated by generation and collection of photo-generated carriers, which is related to optical characteristics of the solar cell, frequency of an incident light source, an interface loss, etc.

The open-circuit voltage refers to a potential difference between both terminals of the solar cell that is obtained when a current through an external circuit of the solar cell is zero, that is, the circuit is in an open-circuit state.

The fill factor refers to a ratio of a maximum power of the solar cell to (a product of the short-circuit current density and the open-circuit voltage). When a series resistance of the solar cell is smaller and a parallel resistance is larger, the fill factor is higher.

The photovoltaic conversion efficiency refers to a ratio of a maximum power output of the solar cell to an incident light power. The photovoltaic conversion efficiency of the solar cell may be effectively improved by adjusting the short-circuit current density, the open-circuit voltage, and the fill factor. For example, in the field of solar cells, the photovoltaic conversion efficiency is used to evaluate the performance of solar cells. The larger the fill factor, the higher the photovoltaic conversion efficiency and the better the performance of the solar cells.

For a large-area solar cell, a plurality of sub-cells are obtained through scribing, to obtain a required voltage and current output. For example, first scribing, second scribing, and third scribing are performed by using a laser method or the like, to implement division and electrical connection (for example, series connection) of the solar cell. A scribing process is as follows: forming a first electrode layer on a substrate; performing scribing to form a first hollowed-out portion, to complete division of sub-cells; forming a photovoltaic conversion module on one side of the first electrode layer that faces away from the substrate, and performing scribing to form a second hollowed-out portion, to complete scribing of channels for series connection of the sub-cells; and forming a second electrode layer on the side of the photovoltaic conversion module that faces away from the substrate, and performing scribing to form a third hollowed-out portion, to complete division of the second electrode layer.

The sub-cell includes a power generation region and a dead region. The dead region is disposed between the power generation regions of two adjacent sub-cells, that is, a region between the first hollowed-out portion and the third hollowed-out portion. The power generation region is a region where light can be effectively used for photovoltaic conversion, for example, a region of each sub-cell where photovoltaic conversion can be performed. In the dead region, light cannot be used, resulting in light waste. There is a contact resistance between the first electrode layer and the second electrode layer that are located in the dead region, and the photovoltaic conversion module located in the dead region has a specific resistance. The above resistances constitute a series resistance, and the larger the series resistance, the smaller a photocurrent; and the smaller the series resistance, the smaller a value of the photocurrent. Moreover, from another point of view, because the fill factor is positively correlated with the series resistance, that is, the larger the series resistance, the lower a value of the fill factor, thereby reducing the photovoltaic conversion efficiency; and the smaller the series resistance, the higher the value of the fill factor, thereby improving the photovoltaic conversion efficiency.

The inventor found that for a thin-film solar cell, an area of the thin-film solar cell is relatively large, it takes a specific amount of time for scribing, and especially in the second scribing process, a relatively long scribing time may cause intrusion of external water vapor and oxygen into a sub-cell, causing an adverse effect on the performance of the solar cell.

In view of this, the embodiments of the present application provide a technical solution. In the technical solution, a solar cell has a plurality of sub-cells, each of the plurality of sub-cells including a first electrode layer, a photovoltaic conversion module, and a second electrode layer that are sequentially stacked along a thickness direction of the sub-cell, the second electrode layer including a main body portion and a connection portion electrically connected to the main body portion, and the connection portion of one of the plurality of sub-cells being configured to be electrically connected to the first electrode layer of another sub-cell, such that the plurality of sub-cells are electrically connected, where a thickness of the main body portion is greater than that of the connection portion. The solar cell of such a structure can be significantly improved in the photovoltaic conversion efficiency thereof.

The technical solution described in the embodiments of the present application is applicable to a photovoltaic module including a solar cell and a power consuming device using the photovoltaic module.

The power consuming device may be a vehicle, a mobile phone, a portable device, a notebook computer, a ship, a spacecraft, an electric toy, an electric tool, etc. The vehicle may be a fuel vehicle, a natural gas vehicle, or a new energy vehicle. The spacecraft includes an airplane, a rocket, an aerospace plane, a spaceship, etc. The electric toy includes a stationary or mobile electric toy, such as a game machine, an electric toy car, an electric toy ship, and an electric toy airplane. The electric tool includes a metal cutting electric tool, a grinding electric tool, an assembling electric tool, and a railway electric tool, such as an electric drill, an electric grinder, an electric wrench, an electric screwdriver, an electric hammer, an electric impact drill, a concrete vibrator, and an electric planer. The foregoing power consuming devices are not specifically limited in the embodiments of the present application.

For ease of description, an example in which a power consuming device refers to a vehicle is used for description in the following embodiments.

As shown in FIG. 1, a photovoltaic module 2 is provided inside a vehicle 1, and the photovoltaic module 2 may be disposed at the top, the head, or the tail of the vehicle 1. The photovoltaic module 2 may be configured to supply power to the vehicle 1. For example, the photovoltaic module 2 may be used as an operating power supply of the vehicle 1.

The vehicle 1 may further include a controller 3 and a motor 4. The controller 3 is configured to control the photovoltaic module 2 to supply power to the motor 4, for example, to satisfy working power requirements during starting, navigation, and traveling of the vehicle 1.

Figure 2:
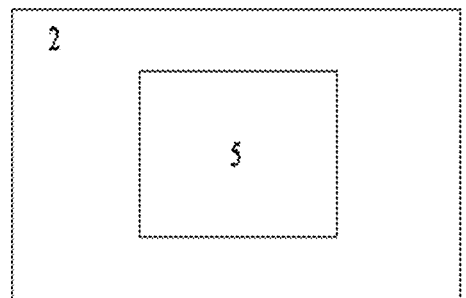
FIG. 2 is a schematic block diagram of a photovoltaic module provided in some embodiments of the present application.

As shown in FIG. 2, the photovoltaic module 2 includes a solar cell 5. There may be one or more solar cells 5. If there are a plurality of solar cells 5, the plurality of solar cells 5 may be connected in series or in parallel or in series and parallel. The series and parallel connection means that the plurality of solar cells 5 are connected in series and parallel, which can provide a higher voltage and capacity.

Figure 3:
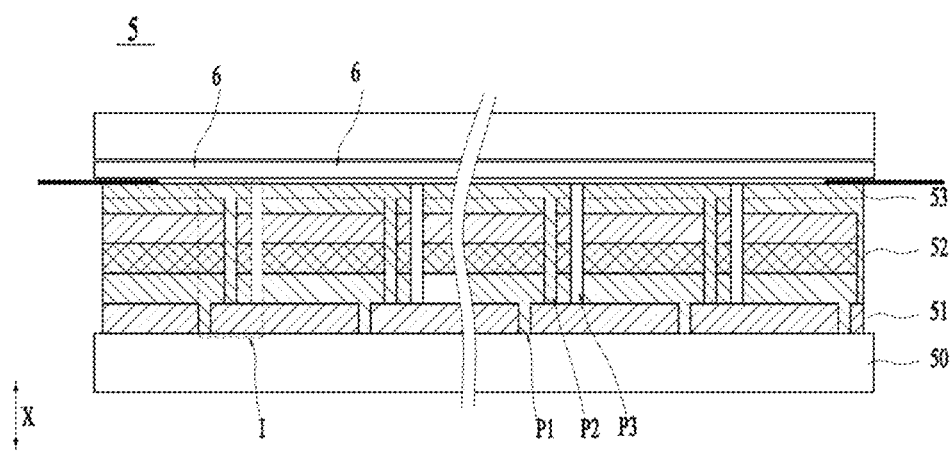
FIG. 3 is a schematic structural diagram of a solar cell provided in some embodiments of the present application.
Figure 4:
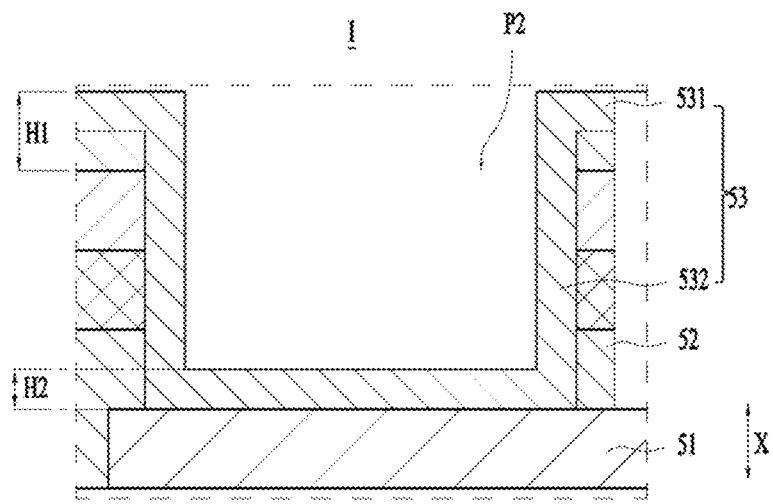
FIG. 4 is a schematic enlarged view of FIG. 3 at I.

As shown in FIG. 3 and FIG. 4, an embodiment of the present application provides a solar cell 5, and the solar cell 5 has a plurality of sub-cells 6, each of the plurality of sub-cells 6 including a first electrode layer 51, a photovoltaic conversion module 52, and a second electrode layer 53 that are sequentially stacked along a thickness direction X of the sub-cell, the second electrode layer 53 including a main body portion 531 and a connection portion 532 electrically connected to the main body portion 531, and the connection portion 532 of one of the plurality of sub-cells 6 being configured to be electrically connected to the first electrode layer 51 of another sub-cell 6, such that the plurality of sub-cells 6 are electrically connected, where a thickness of the main body portion 531 is greater than that of the connection portion 532.

The solar cell 5 has the plurality of sub-cells 6, and the plurality of sub-cells 6 are connected in series, so that a maximum output power of the solar cell 5 can be increased, and a fill factor of the solar cell can be increased. As the number of sub-cells 6 connected in series increases, a constant current effect can be improved, and an open-circuit voltage can be increased, which can satisfy the use under external loads.

It should be noted herein that each film layer in the sub-cell 6 is formed on a substrate 50, with the substrate 50 used as a bearing base, the first electrode layer 51 is first formed on the substrate 50, the photovoltaic conversion module 52 is then formed on one side of the first electrode layer 51 that faces away from the substrate 50, and the second electrode layer 53 is formed on one side of the photovoltaic conversion module 52 that faces away from the substrate 50. Exemplarily, the substrate 50 is used as a bearing base and has insulating properties, and the substrate 50 may be a flexible substrate or a rigid substrate. The rigid substrate may include a glass substrate; and the flexible substrate may be made of polyethylene glycol terephthalate (PEI) or polyimide (PI).

The photovoltaic conversion module 52 serves as a core function layer of the sub-cell 6, and a main function of the photovoltaic conversion module is to absorb external light to form electron-electron hole pairs inside the photovoltaic conversion module, and the electrons and electron holes are split, extracted, and output for external output. Exemplarily, the photovoltaic conversion module 52 may be a perovskite photovoltaic conversion module, or another photovoltaic conversion module 52 such as a cadmium zinc telluride photovoltaic conversion module or a copper indium gallium selenide photovoltaic conversion module.

The photovoltaic conversion module 52 may include a plurality of transport layers for transporting electrons and electron holes, respectively. Certainly, the photovoltaic conversion module 52 may further include a function layer for improving transport efficiency of electrons and electron holes and reducing a risk of recombination of electrons and electron holes.

The first electrode layer 51 and the second electrode layer 53 are separately configured to be electrically connected to the photovoltaic conversion modules 52, the first electrode layer 51 is configured to collect electron holes, and the second electrode layer 53 is configured to collect electrons. The first electrode layer 51 and the second electrode layer 53 may be made of the same material or different materials. Exemplarily, both the first electrode layer 51 and the second electrode layer 53 may be made of a metal material, or the first electrode layer 51 may be made of a transparent conductive material, and the second electrode layer 53 may be made of a metal material or the like. The metal material has a large number of free electrons, and therefore has good metallic conductivity. The transparent conductive material has electrical conductivity and light transmittance.

The second electrode layer 53 of one of two adjacent sub-cells 6 is connected to the first electrode layer 51 of the other sub-cell, to implement series connection of the two adjacent sub-cells 6. In the embodiment of the present application, the second electrode layer 53 includes the main body portion 531 and the connection portion 532, and the connection portion 532 is connected to the main body portion 531. The main body portion 531 of the sub-cell 6 is located on one side of the photovoltaic conversion module 52 that faces away from the first electrode layer 51, the connection portion 532 of the sub-cell 6 penetrates the photovoltaic conversion module 52, one end of the connection portion 532 is connected to the main body portion 531, and the other end of the connection portion 532 is connected to the first electrode layer 51 of another sub-cell 6.

When the second electrode layer 53 is formed, at least part of the main body portion 531 is integrally provided with the connection portion 532, and the main body portion 531 and the connection portion 532 are mechanically connected, or can be electrically connected in a mechanical connection manner.

The second electrode layer 53 may be made of the same material, or may be made of a plurality of materials.

When the second electrode layer 53 is made of the same material, the material is provided on the side of the photovoltaic conversion module 52 that faces away from the first electrode layer 51 to form a film layer first, scribing is then performed on the film layer and the photovoltaic conversion module 52 to form a second hollowed-out portion, and the same material is provided in the second hollowed-out portion and one side of the film layer that faces away from the first electrode layer 51 to form the other film layer. Considering that the two film layers formed are made of the same material, there is no obvious interface between the two film layers.

When the second electrode layer 53 is made of a plurality of materials, for example, the plurality of materials include a first material and a second material, the first material is first provided on the side of the photovoltaic conversion module 52 that faces away from the first electrode layer 51 to form a first film layer, scribing is then performed on the first film layer and the photovoltaic conversion module 52 to form a second hollowed-out portion P2, and the second material is provided in the second hollowed-out portion P2 and one side of the first film layer that faces away from the first electrode layer 51 to form a second film layer. Considering that the two film layers formed are made of different materials, there is a specific interface between the two film layers.

Certainly, the plurality of materials may further include a third material. On a basis that the first film layer is formed, the second film layer is formed on the side of the first film layer that faces away from the first electrode layer 51, scribing is performed on the second film layer, the first film layer, and the photovoltaic conversion module 52 to form the second hollowed-out portion P2, and the third material is used for the second hollowed-out portion P2 and one side of the second film layer that faces away from the first electrode layer 51 to form a third film layer. Alternatively, on the basis that the first film layer is formed, scribing is performed on the first film layer and the photovoltaic conversion module 52 to form the second hollowed-out portion P2, the second film layer is formed in the second hollowed-out portion P2 and the side of the first film layer that faces away from the first electrode layer 51, and the third film layer is formed on the side of the second film layer that faces away from the first electrode layer 51. The plurality of materials may further include more materials, or a combination of a plurality of materials may be used for forming one of the film layers.

In each of the above examples, before the second hollowed-out portion P2 is formed through scribing, at least one film layer is pre-formed, and the film layer can have a protective effect on the photovoltaic conversion module 52. The second hollowed-out portion P2 is formed through scribing under the protective effect of the film layer, which can reduce a risk of intrusion of external water vapor and oxygen into the photovoltaic conversion module 52, thereby ensuring stable performance of the solar cell 5.

Scribing may be performed by laser scribing, masking, or exposure, in which laser scribing is used as an example. A laser beam is emitted to a surface of a film layer, laser energy contained in the laser beam is transferred into the film layer, and the pre-formed film layer has good heat conductivity and may conduct heat evenly and quickly in the scribing process, so that the second hollowed-out portion P2 formed through scribing is relatively regular at the edge.

The part of the photovoltaic conversion module 52 that faces away from the first electrode layer 51 constitutes the main body portion 531 of the second electrode layer 53, and the part of the photovoltaic conversion module located in the second hollowed-out portion P2 constitutes the connection portion 532 of the second electrode layer 53. The main body portion 531 includes at least two film layers. Compared with the main body portion 531, the connection portion 532 includes less film layers than the main body portion 531. Part of the main body portion 531 can pre-protect the sub-cell 6 in the scribing process. A difference in the numbers of film layers of the main body portion 531 and the connection portion 532 is macroscopically manifested in that the thickness of the main body portion 531 is greater than that of the connection portion 532. In FIG. 4, H1 represents the thickness of the main body portion 531, H2 represents the thickness of the connection portion 532, and X represents the thickness direction of the sub-cell.

Therefore, in the embodiment of the present application, when the structure of the sub-cell 6 is formed, the thickness of the main body portion 531 is set to be greater than that of the connection portion 532, so that the main body portion 531 can have a protective effect on the photovoltaic conversion module 52, a risk of intrusion of external water vapor and oxygen into the photovoltaic conversion module 52 can be reduced, and stable performance of the photovoltaic conversion module 52 can be ensured, thereby ensuring photovoltaic conversion efficiency of the solar cell 5. In addition, when the second hollowed-out portion P2 is formed through scribing, part of the main body portion 531 can have a good heat conduction effect, a heat island formed at the edge of the structure of the second hollowed-out portion P2 formed through scribing is relatively small, and the structure of the sub-cell 6 is relatively stable, so that the photovoltaic conversion efficiency of the solar cell can be improved.

In some embodiments, a ratio of the thickness of the main body portion 531 to that of the connection portion 532 is denoted by A, and $1 < A \leq 20$.

When A is equal to 1, in this case, the main body and the connection portion are integrally formed, that is, the second electrode layer includes one film layer. In the scribing process, the second hollowed-out portion needs to be first formed through scribing, and then the second electrode layer is formed, and consequently the main body portion cannot have a protective effect on the photovoltaic conversion module.

When A is greater than 20, the thickness of the main body portion is much greater than that of the connection portion. In this case, the thickness of the main body portion accounts for a relatively large proportion of the overall thickness of the sub-cell, especially the thickness of the photovoltaic conversion module accounts for a relatively small proportion, and the photovoltaic conversion module has a relatively small degree of light absorption, thereby reducing an amount of photocurrent that the sub-cell can output after conversion, and reducing the photovoltaic conversion efficiency of the solar cell.

In the embodiment of the present application, the ratio of the thickness of the main body portion 531 to that of the connection portion 532 satisfies 1<A≤20. The upper limit of A may be selected from 3, 4, 5, 6, 7, 8, 9, 10, 15, or 20, and the lower limit of A may be selected from 2, 3, 4, 5, 6, 7, 8, 9, 10, or 15. The range of A may be selected from any proper combination of the above upper limit values and lower limit values, for example, 1<A≤10. When A satisfies the above range, the main body portion 531 may not only have a good protective effect on the photovoltaic conversion module 52, but also improve the photovoltaic conversion efficiency of the solar cell 5.

The main body portion 531 may be made of one material or a plurality of materials, and the material of the main body portion 531 is described next.

In some embodiments, the main body portion 531 is made of the same material. On a basis that the thickness of the main body portion 531 is greater than the thickness of the connection portion 532, the main body portion 531 includes at least two film layers, the film layers are made of the same material, and there is substantially no interface between the two film layers formed, in other words, there is substantially no interface inside the main body portion 531, so that the structural stability of the main body portion 531 as a whole can be improved. Exemplarily, the material of the main body portion 531 includes aurum (Au), argentum (Ag), cuprum (Cu), aluminum (Al), a transparent conductive oxide (TCO), or carbon. TCO includes fluorine-doped tin oxide (FTO, $SnO_2$:F), indium tin oxide (ITO, $In_2O_3$:Sn), aluminum-doped zinc oxide (AZO, ZnO:Al), or antimony-doped tin oxide (ATO, $Sn_2O$:Sb). In the above abbreviations, $SnO_2$:F is used as an example, and represents tin oxide ($SnO_2$) doped with fluorine (F).

Certainly, each of the film layers may be made of a mixed material, and the materials of the film layers are substantially the same, there is substantially no interface between the film layers, and the structure of the main body portion 531 is relatively stable. Exemplarily, the material of the main body portion 531 may include at least two of aurum (Au), argentum (Ag), cuprum (Cu), and aluminum (Al).

In some other embodiments, the main body portion 531 is made of a plurality of materials. On the basis that the thickness of the main body portion 531 is greater than that of the connection portion 532, the main body portion 531 includes at least two film layers, and the film layers may be made of different materials. For example, a film layer first formed on the photovoltaic conversion module 52 is made of a first material, and the other film layer formed on a surface of the film layer that faces away from the first electrode layer 51 is made of a second material. The first material may be selected from materials having relatively good heat conductivity, which is conducive to conducting head in the scribing process. The second material may be selected from materials having relatively good heat conductivity, which is conducive to improving electron transport efficiency. In other words, the main body portion 531 is made of a plurality of materials, which is conducive to comprehensively improving the performance of the solar cell 5. Exemplarily, the material of each of the film layers in the main body portion 531 may be independently selected from aurum (Au), argentum (Ag), cuprum (Cu), aluminum (Al), a transparent conductive oxide (TCO), or carbon.

Figure 5:
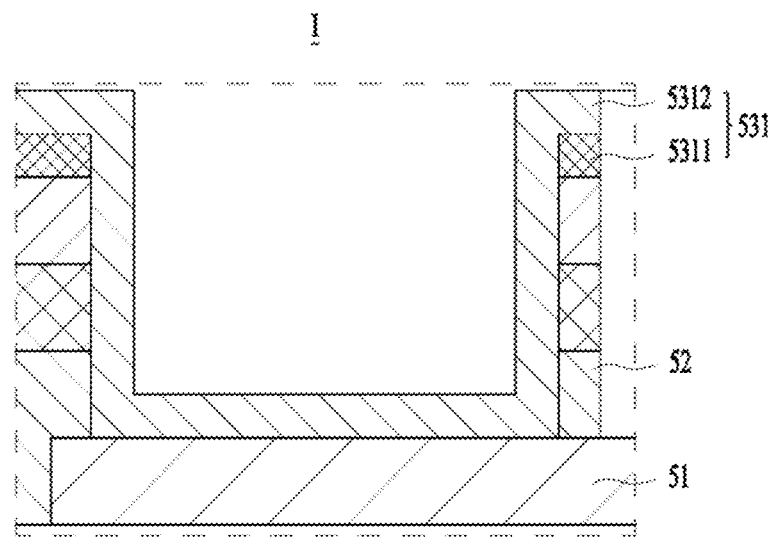
FIG. 5 is another schematic enlarged view of FIG. 3 at I.

As shown in FIG. 5, on the basis that the film layers of the main body portion 531 are made of different materials, the main body portion 531 includes a first part 5311 and a second part 5312, the second part 5312 is located on one side of the first part 5311 that faces away from the first electrode layer 51, and the first part 5311 and the second part 5312 are made of different materials. Exemplarily, each of the first part 5311 and the second part 5312 may be independently selected from aurum (Au), argentum (Ag), cuprum (Cu), aluminum (Al), a transparent conductive oxide (TCO), or carbon. The first part 5311 may protect the photovoltaic conversion module 52 well, and have a good heat conduction effect in the scribing process. The second part 5312 may have a good electric conduction effect, which is conducive to transporting electrons.

Figure 6:
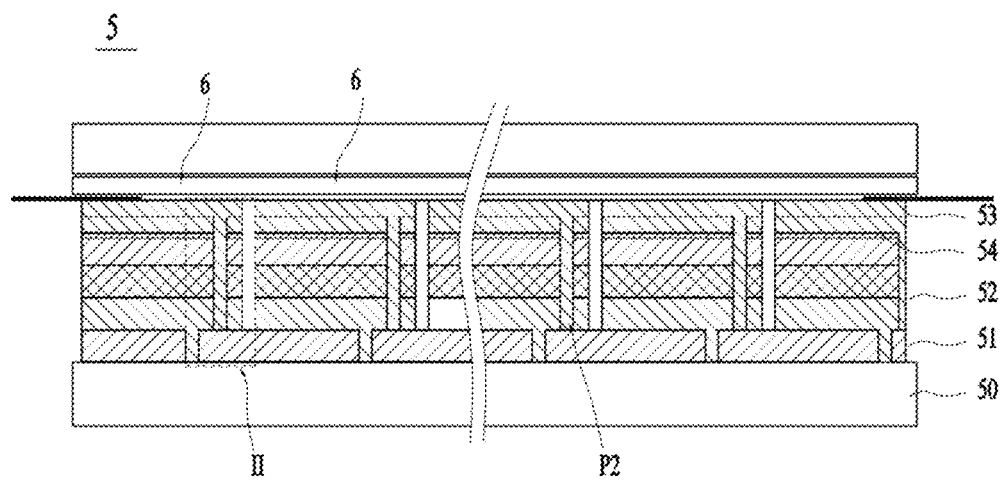
FIG. 6 is a schematic structural diagram of a solar cell provided in some other embodiments of the present application.

As shown in FIG. 6, in some embodiments, the sub-cell 6 includes a barrier layer 54 for blocking transport of first charges, and the barrier layer 54 is disposed on the side of the photovoltaic conversion module 52 that faces away from the first electrode layer 51. Exemplarily, the first charges may be electron holes, and correspondingly, second charges mentioned below may be electrons. The barrier layer 54 can block transport of electron holes at the interface of the photovoltaic conversion module 52, so that transport efficiency of electrons from the photovoltaic conversion module 52 to the second electrode layer 53 is improved, a risk of recombination of electrons and electron holes at the interface of the photovoltaic conversion module 52 can be reduced, and the transport efficiency of electrons is further improved, thereby improving the photoelectron conversion efficiency of the solar cell 5.

Optionally, the material of the barrier layer 54 includes at least one of a block copolymer (BCP), lithium fluoride (LiF), and stannic oxide ($SnO_2$). BCP is used as an example for description. BCP can sufficiently fill parts between crystal boundaries on the surface of the photovoltaic conversion module 52, can reduce the number of electron holes accumulated at the interface, and can suppress the recombination of electrons and electron holes at the interface.

The second hollowed-out portion needs to be formed through scribing after the barrier layer is formed, and as a result, an exposure duration of the barrier layer is relatively long, and the barrier layer is easily intruded by external water vapor and oxygen.

Figure 7:
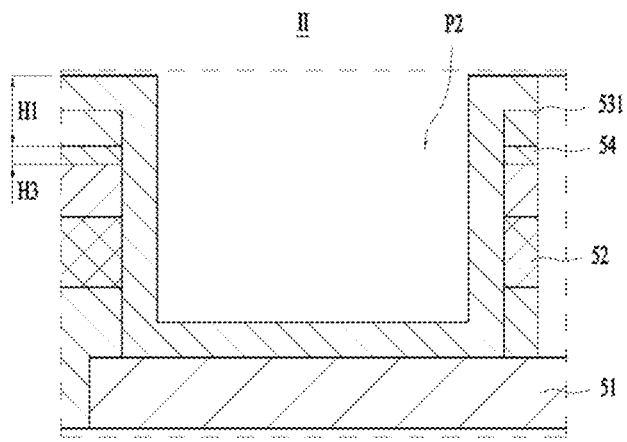
FIG. 7 is a schematic enlarged view of FIG. 6 at II.

As shown in FIG. 7, to ensure the performance of the solar cell 5, in the embodiment of the present application, the barrier layer 54 is located between the photovoltaic conversion module 52 and the main body portion 531, and the main body portion 531 can protect the barrier layer 54 and reduce the risk of intrusion of external water vapor and oxygen into the barrier layer 54, thereby ensuring the performance of the solar cell 5. Specifically, the main body portion 531 includes at least two film layers. Before the second scribing is performed, at least one film layer is first formed on the barrier layer 54, and the second scribing is then performed under the protection of the film layer to form the second hollowed-out portion P2.

Optionally, a ratio of a weight of the barrier layer 54 to that of the main body portion 531 is denoted by B, and 0.001≤B≤0.2; and optionally, 0.005≤B≤0.1.

When the weight of the barrier layer 54 is excessively large, the thickness of the barrier layer is relatively large, and the thickness of the barrier layer 54 accounts for a relatively large proportion of the overall thickness of the sub-cell 6, which may cause the thickness of the photovoltaic conversion module 52 of the sub-cell 6 to account for a relatively small proportion, reducing the photovoltaic conversion efficiency. If the weight of the barrier layer 54 is excessively small, the thickness of the barrier layer 54 is relatively small, and the barrier layer 54 may not have a good effect of blocking electron holes. In FIG. 7, H1 represents the thickness of the main body portion, and H3 represents the thickness of the barrier layer 54.

B satisfies $0.001 \leq B \leq 0.2$, and optionally, $0.005 \leq B \leq 0.1$. On a basis that the barrier layer has a good effect of blocking electron holes, the main body portion 531 may have a good protective effect on the barrier layer 54, thereby improving the photovoltaic conversion efficiency of the solar cell 5.

Optionally, a ratio of a thickness of the barrier layer 54 to that of the main body portion 531 is denoted by C, and $0.005 \leq C \leq 0.2$; and optionally, $0.01 \leq C \leq 0.1$.

When the thickness of the barrier layer 54 is relatively large, the thickness of the barrier layer 54 accounts for a relatively large proportion of the overall thickness of the sub-cell 6, which may cause the thickness of the photovoltaic conversion module 52 of the sub-cell 6 to account for a relatively small proportion, reducing the photovoltaic conversion efficiency. When the thickness of the barrier layer 54 is relatively small, the barrier layer 54 may not have a good effect of blocking electron holes.

C satisfies $0.005 \leq C \leq 0.2$; and optionally, $0.01 \leq C \leq 0.1$. On a basis that the barrier layer has a good effect of blocking electron holes, the main body portion 531 may have a good protective effect on the barrier layer 54, thereby improving the photovoltaic conversion efficiency of the solar cell 5.

Figure 8:
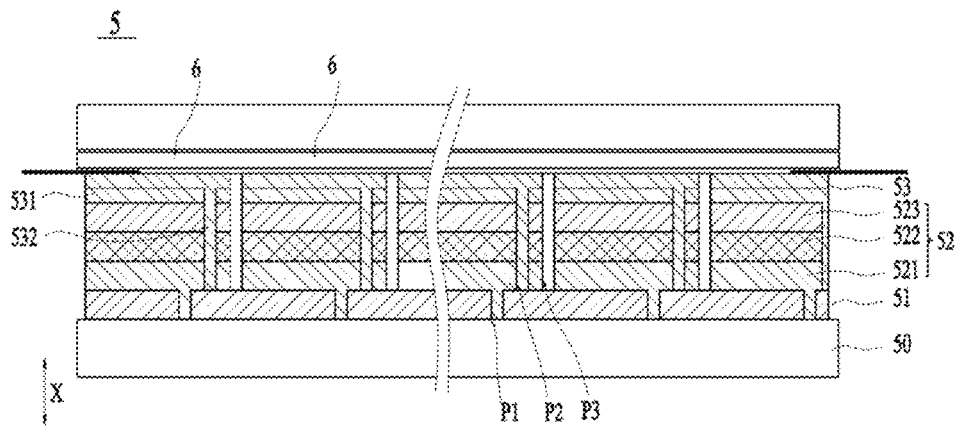
FIG. 8 is a schematic structural diagram of a solar cell provided in some still other embodiments of the present application.

As shown in FIG. 8, the photovoltaic conversion module 52 is a core component of the solar cell 5, and the structure of the photovoltaic conversion module 52 will be described next.

In some embodiments, the photovoltaic conversion module 52 includes a first charge transport layer 521, a photovoltaic conversion layer 522, and a second charge transport layer 523 that are sequentially stacked along the thickness direction of the sub-cell 6, and the first charge transport layer 521 is located between the first electrode layer 51 and the photovoltaic conversion layer 522. The first charge transport layer 521 is an electron hole transport layer, and the second charge transport layer 523 is an electron transport layer. The solar cell 5 includes the substrate 50, the first electrode layer 51, the first charge transport layer 521, the photovoltaic conversion layer 522, the second charge transport layer 523, and the second electrode layer 53 that are sequentially disposed along the thickness direction X of the solar cell.

The material of the first charge transport layer 521 includes at least one of poly[bis(4-phenyl)(2,4,6-trimethylphenyl)amine (PTAA), poly(3,4-ethylenedioxythiophene) (PEDOT), nickel oxide (NiOx), CuI, and $Cu_2O$. The first charge transport layer 521 is disposed between the first electrode layer 51 and the photovoltaic conversion layer 522, so that a good ohmic contact can be formed, electron holes can be effectively transported, recombination of carriers at the interface can be reduced, and the photovoltaic conversion efficiency can be improved.

The material of the photovoltaic conversion layer 522 conforms to the $ABX_3$ crystal structure, the $ABX_3$ crystal structure is a crystal structure of an organic-inorganic hybrid perovskite material, which is of a cubic or octahedral structure. A includes at least one of methylammonium (MA), formamide (FA), and cesium (Cs), B includes at least one of plumbum (Pb), stannum (Sn), and cuprum (Cu), and X includes at least one of bromine (Br), chlorine (Cl), and iodine (I). The photovoltaic conversion layer 522 may absorb photons and convert light into electrons and electron holes, and respectively transport electrons and electron holes to the first charge transport layer 521 and the second charge transport layer 523 under the action of a built-in electric field.

The material of the second charge transport layer 523 includes at least one of C60, stannic oxide ($SnO_2$), a fullerene derivative (PCBM), and titanium oxide ($TiO_2$). The second charge transport layer 523 is disposed between the photovoltaic conversion layer 522 and the second electrode layer 53, so that the energy level potential barrier between the photovoltaic conversion layer 522 and the second electrode layer 53 can be reduced, which is conducive to transporting electrons and improving electron transport efficiency. In addition, the second charge transport layer 523 is conducive to transporting electrons, blocking electron holes, and reducing a risk of recombination of carriers at the interface.

In some embodiments, the material of the first electrode layer 51 includes aurum (Au), argentum (Ag), cuprum (Cu), aluminum (Al), a transparent conductive oxide (TCO), or carbon. Aurum (Au), argentum (Ag), cuprum (Cu), and aluminum (Al) are used as metal electrodes, which have good electrical conductivity. The transparent conductive oxide (TCO) is used as a transparent electrode, and the transparent electrode includes fluorine-doped tin oxide (FTO), indium tin oxide (ITO), or aluminum-doped zinc oxide (AZO). The first electrode layer 51 made of the above material has better electrical conductivity and is conducive to transporting electron holes.

Figure 9:
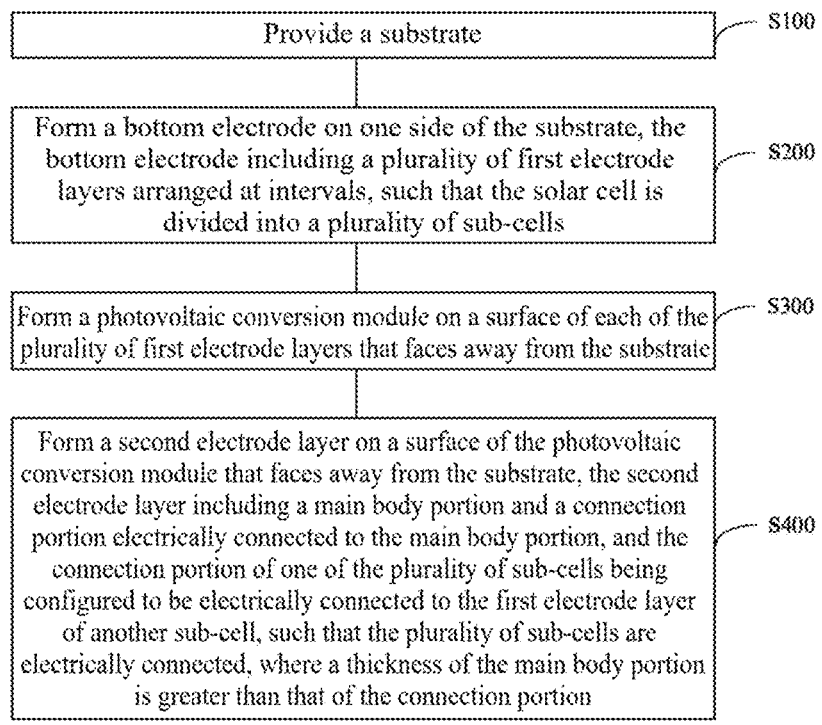
FIG. 9 is a schematic diagram of a process of preparing a solar cell provided in some embodiments of the present application.

As shown in FIG. 8 and FIG. 9, an embodiment of the present application provides a method for preparing a solar cell, including the following steps.

In S100, a substrate is provided.

In S200, a bottom electrode is formed on one side of the substrate, the bottom electrode including a plurality of first electrode layers disposed at intervals, such that the solar cell is divided into a plurality of sub-cells.

The bottom electrode such as a transparent glass electrode is formed on a surface of the substrate 50 through magnetron sputtering or a chemical method, the bottom electrode may be divided into a plurality of first electrode layers 51 through scribing, a gap between the plurality of first electrode layers 51 is a first hollowed-out portion P1, and a method for scribing may include laser scribing, masking, or exposure.

In S300, a photovoltaic conversion module is formed on a surface of each of the plurality of first electrode layers that faces away from the substrate.

The photovoltaic conversion module 52 includes a first charge transport layer 521 (an electron hole transport layer), a photovoltaic conversion layer 522, and a second charge transport layer 523 (an electron transport layer) that are sequentially stacked along a thickness X direction of the photovoltaic conversion module.

The first charge transport layer 521 is formed, through magnetron sputtering, chemical deposition, atomic layer deposition (ALD), or coating, on a surface of the first electrode layer 51 that faces away from the substrate 50. The first hollowed-out portion P1 may be filled with an insulating material, and certainly, may alternatively be directly provided with the material of the first charge transport layer 521.

The photovoltaic conversion layer 522 is formed, through coating, spray coating, spin coating, evaporation, or chemical deposition, on a surface of the first charge transport layer 521 that faces away from the substrate.

The second charge transport layer 523 is formed, through magnetron sputtering, chemical deposition, atomic layer deposition (ALD), or coating, on a surface of the photovoltaic conversion layer 522 that faces away from the substrate 50.

The scribing is performed through laser scribing, masking, or exposure, such that the second hollowed-out portion P2 penetrating the first charge transport layer 521, the photovoltaic conversion layer 522, and the second charge transport layer 523 is formed in the first charge transport layer 521, the photovoltaic conversion layer 522, and the second charge transport layer 523.

In S400, a second electrode layer is formed on a surface of the photovoltaic conversion module that faces away from the substrate, the second electrode layer including a main body portion and a connection portion electrically connected to the main body portion, and the connection portion of one of the plurality of sub-cells being configured to be electrically connected to the first electrode layer of another sub-cell, such that the plurality of sub-cells are electrically connected, where a thickness of the main body portion is greater than that of the connection portion.

The second electrode layer 53 such as a metal electrode is formed, through magnetron sputtering, chemical deposition, atomic layer deposition (ALD), or coating, in the second hollowed-out portion P2 and on the surface of the photovoltaic conversion module 52 that faces away from the substrate 50. The metal electrode located in the second hollowed-out portion P2 implements series connection of adjacent sub-cells 6.

The scribing is performed through laser scribing, masking, or exposure, such that a third hollowed-out portion P3 is formed in the metal electrode, the first charge transport layer 521, the photovoltaic conversion layer 522, and the second charge transport layer 523.

The main body portion 531 of the second electrode layer 53 is located on the side of the photovoltaic conversion module 52 that faces away from the substrate 50, and the connection portion 532 of the second electrode layer 53 is located in the second hollowed-out portion P2. After the second electrode layer 53 is formed, scribing is performed on the second electrode layer 53 and the photovoltaic conversion module 52 to form the third hollowed-out portion P3, and the third hollowed-out portion P3 penetrates the second electrode layer 53 and the photovoltaic conversion module 52.

According to the solar cell prepared using the preparation method in the embodiment of the present application, the thickness of the main body portion is greater than that of the connection portion, so that photovoltaic conversion efficiency of the solar cell can be improved.

Figure 10:
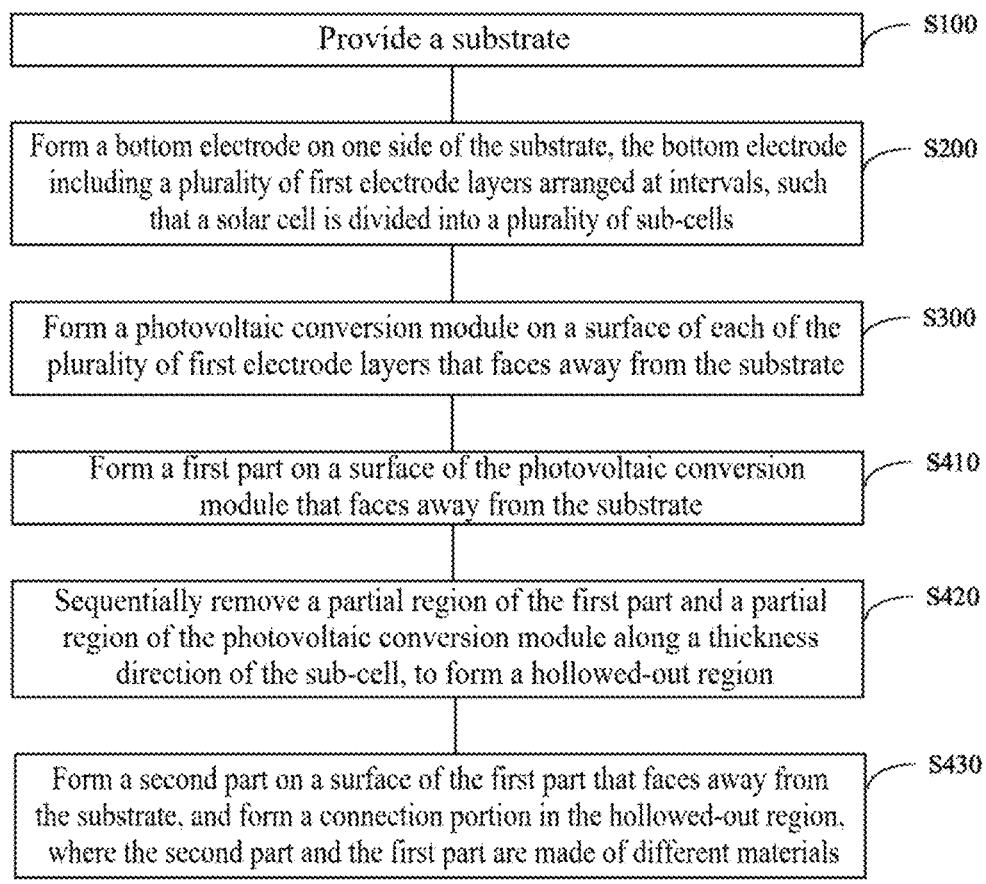
FIG. 10 is a schematic diagram of a process of preparing a solar cell provided in some other embodiments of the present application.

As shown in FIG. 10, in some embodiments, step S400 includes the following steps.

In S410, a first part is formed on the surface of the photovoltaic conversion module that faces away from the substrate.

In S420, a partial region of the first part and a partial region of the photovoltaic conversion module are sequentially removed along a thickness direction of the sub-cell, to form a hollowed-out region.

The hollowed-out region in this step is the second hollowed-out portion mentioned above.

In S430, a second part is formed on a surface of the first part that faces away from the substrate, and a connection portion is formed in the hollowed-out region, where the second part and the first part are made of different materials.

The second part and the first part are made of different materials, so that the formed second electrode layer can have both electrical conductivity and heat conductivity, thereby comprehensively improving the performance of the solar cell.

Figure 11:
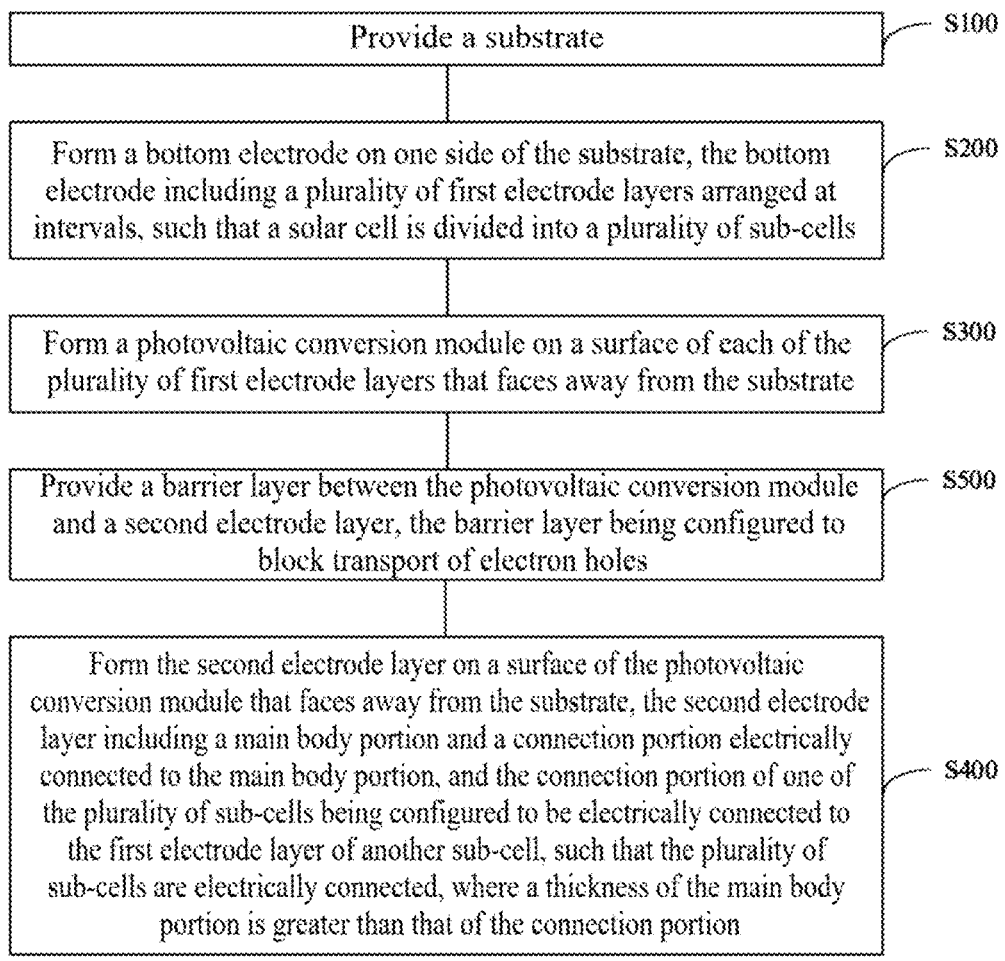
FIG. 11 is a schematic diagram of a process of preparing a solar cell provided in some still other embodiments of the present application.

As shown in FIG. 11, in some embodiments, after step S300, the method further includes the following step.

In S500, a barrier layer is provided between the photovoltaic conversion module and the second electrode layer, and the barrier layer is configured to block transport of electron holes.

The barrier layer is provided, so that transport of electron holes can be blocked, a risk of recombination of electron holes and electrons at the interface of the photovoltaic conversion module can be reduced, and the photovoltaic conversion efficiency of the solar cell can be improved.

On a basis of the above steps, the positive output electrode and the negative output electrode may be welded through bonding using a conductive tape, ultrasonic welding, laser welding, or using a welding flux to constitute output electrodes.

EXAMPLES

Hereinafter, the examples of the present application will be explained. The examples described below are exemplary and are merely for explaining the present application, and should not be construed as limiting the present application. The examples in which techniques or conditions are not specified are based on the techniques or conditions described in documents in the art or according to the product introduction. The reagents or instruments used therein for which manufacturers are not specified are all conventional products that are commercially available.

Examples 1-12 and Comparative Examples 1 and 2

A group of FTO conductive glass with a size of 100 mm×100 mm is provided, and scribing is performed on the glass using infrared laser (with a wavelength of 1064 nm) to form first hollowed-out portions P1 each with a width of about 30 um, to divide the whole piece of glass into 10 sub-cells, a series resistance of different sub-cells is greater than 10 MΩ, and a gap of 10 mm is reserved on each of the upper edge and the lower edge of the glass as a region for welding of the module. After being cleaned using a cleaning agent (a variety of active substances and an alkali promoter), the glass is ultrasonically oscillated in deionized water, ethanol, and acetone in sequence for 10 min, and then dried using $N_2$ for use after ultrasonic treatment.

The cleaned FTO conductive glass is put into a magnetron sputtering device (with a specific amount of $Ar:O_2$ introduced), to form an electron hole transport layer NiOx by deposition, with a thickness of about 15 nm.

The FTO conductive glass is irradiated with ultraviolet (with a wavelength of 253.7 nm) for 10 min, a surface of the electron hole transport layer that faces away from the FTO conductive glass is coated with a perovskite solution ($FA_xCs_{1-x}PbI_yBr_{3-y}$) to form a perovskite absorption layer, which is crystallized into a film (VCD, annealed at 120 for 20 min), and the FTO conductive glass is taken down for use.

The module on which the perovskite absorption layer is formed is put into a vacuum thermal evaporation device, and vacuuming is performed to reach $4\times10^{-4}$ Pa, and a nm C60 electron transport layer is sequentially deposited on a surface of the perovskite absorption layer that faces away from the FTO conductive glass.

A barrier layer (thermally evaporated BCP, with a thickness of 6 nm) is formed on a surface of the electron transport layer that faces away from the FTO conductive glass. The material, weight, and thickness of the barrier layer are shown in Table 1.

A first part is formed on a surface of the barrier layer that faces away from the FTO conductive glass, and the material, weight, and thickness of the first part are shown in Table 1.

The module is cooled to about 30° C., and taken out after vacuum breaking and subjected to laser etching to the surface of the FTO conductive glass, to form the second hollowed-out portion P2 with a width of 150 um, where a distance between P2 and P1 is 20 um.

The module is put into the vacuum thermal evaporation device again, and a second part is formed by deposition. The material, weight, and thickness of the second part are shown in Table 1.

The module is cooled to about 30° C., and taken out after vacuum breaking and subjected to P-second green laser etching to the FTO conductive glass, to form the third hollowed-out portion P3 with a width of 15 um, where a distance between P3 and P2 is 20 um.

Then, the module is subjected to edge bead removal using infrared laser (with a wavelength of 1064 nm), that is, each of two sides of the module is etched away by 10 mm to obtain the solar cell.

Performance Test

1. Test of Photovoltaic Conversion Efficiency

An effective area of 64 cm$^2$ of the solar cell, a test voltage of −2 V to 14 V, and a scan rate (320 scan points) are input into a solar simulator (meeting the 3A standard) of 1000 W/m2 at 25° C., to test the energy conversion efficiency of the solar cell.

2. Thickness Test of the First Part and the Second Part

A glass cutter is used to make a cut in the back surface of the solar cell along a direction of parallel incident light to break the solar cell, and a scanning electron microscope is used to shoot 10 points of a section containing P2 at a 30,000 or 50,000 magnification, to obtain a thickness of the bottom of P2 (the second part) and a thickness of the edge of P2 (first part).

3. Thickness Test of the Barrier Layer

The electrodes are removed using an adhesive tape and an ellipsometer is used to test the thickness.

Parameters and performance of the solar cell in examples 1 to 12 and comparative examples 1 and 2 are shown in Table 1.

TABLE 1

| | Second electrode layer | | | | | | | | | | |
|---|---|---|---|---|---|---|---|---|---|---|---|
| | Main body portion | | | | | | | | | | |
| | First part | | Second part | | Sum of thicknesses of the first part and the second part | Connection portion | | Barrier layer | | | | Photovoltaic conversion efficiency/% |
| | Material | Thickness/nm | Material | Thickness/nm | | Material | Thickness/nm | Material | Thickness/nm | A | C | |
| Example 1 | Cu | 30 | Cu | 60 | 90 | Cu | 60 | BCP | 6 | 1.5 | 0.067 | 17.0 |
| Example 2 | Cu | 40 | Cu | 50 | 90 | Cu | 50 | BCP | 6 | 1.8 | 0.067 | 14.4 |
| Example 3 | Cu | 60 | Cu | 30 | 90 | Cu | 30 | BCP | 6 | 3.0 | 0.067 | 10.8 |
| Example 4 | Cu | 80 | Cu | 10 | 90 | Cu | 10 | BCP | 6 | 9.0 | 0.067 | 10.0 |
| Example 5 | Cu | 30 | Al | 60 | 90 | Al | 60 | BCP | 6 | 10.0 | 0.067 | 8.0 |
| Example 6 | Cu | 30 | Cu | 60 | 10 | Cu | 60 | BCP | 0.05 | 1.5 | 0.005 | 10.5 |
| Example 7 | Cu | 30 | Cu | 60 | 60 | Cu | 60 | BCP | 0.5 | 1.5 | 0.008 | 12.0 |
| Example 8 | Cu | 30 | Cu | 60 | 90 | Cu | 60 | BCP | 1 | 1.5 | 0.011 | 13.0 |
| Example 9 | Cu | 30 | Cu | 60 | 90 | Cu | 60 | BCP | 6 | 1.5 | 0.067 | 14.2 |
| Example 10 | Cu | 30 | Cu | 60 | 90 | Cu | 60 | BCP | 8.5 | 1.5 | 0.094 | 17.0 |
| Example 11 | Cu | 30 | Cu | 60 | 90 | Cu | | BCP | 15 | 1.5 | 0.167 | 15.3 |
| Example 12 | Cu | 30 | Cu | 60 | 90 | Cu | 60 | BCP | 30 | 1.5 | 0.333 | 14.0 |
| Comparative Example 1 | None | 0 | Cu | 90 | 90 | Cu | 90 | BCP | 6 | 1.0 | 0.067 | 5.0 |
| Comparative example 2 | Cu | 87 | Cu | 3 | 90 | Cu | 3 | BCP | 6 | 30.0 | 0.067 | 0.1 |

As shown in Table 1, the second part is not included in Comparative Example 1, that is, the photovoltaic conversion module is substantially not protected in the second scribing process, and the photovoltaic conversion efficiency is lower.

Compared to Comparative Example 1, the photovoltaic conversion efficiency of the solar cell in Examples 1 to 12 is significantly improved.

In Comparative Example 2, the thickness of the main body portion is relatively large, so that the thickness of the photovoltaic conversion module accounts for a relatively small proportion, and the photovoltaic conversion efficiency of the solar cell is relatively low.

Compared to Comparative Example 2, the thickness of the main body portion in Examples 1 to 5 is moderate, especially the ratio A of the thickness of the main body portion to that of the connection portion satisfies 1<A≤20, especially when 1<A≤10, the photovoltaic conversion efficiency of the solar cell is excellent, and the photovoltaic conversion efficiency of the solar cell in Example 1 is particularly excellent.

In Examples 6 to 12, the range of the ratio C of the thickness of the barrier layer to that of the main body portion is adjusted, so that the photovoltaic conversion efficiency of the solar cell can be adjusted. When C satisfies 0.005≤C≤0.2, especially when 0.01≤C≤0.1, the photovoltaic conversion efficiency of the solar cell is excellent.

While the present application has been described with reference to the preferred embodiments, various modifications can be made, and equivalents can be provided to substitute for the components thereof without departing from the scope of the present application. In particular, the technical features mentioned in the embodiments can be combined in any manner, as long as there is no structural conflict. The present application is not limited to the specific embodiments disclosed herein but includes all the technical solutions that fall within the scope of the claims.

The invention claimed is:

1. A solar cell having a plurality of sub-cells on a substrate, each of the plurality of sub-cells comprising a first electrode layer, a photovoltaic conversion module, and a second electrode layer that are sequentially stacked along a thickness direction of the sub-cell, the second electrode layer comprising a main body portion and a connection portion electrically connected to the main body portion, the connecting portion including a part formed on a surface of the first electrode layer facing away from the substrate in a hollow-out portion and another part extending from the part in the thickness direction in contact with a side surface of the photoelectric conversion module, and the connection portion of one of the plurality of sub-cells being configured to be electrically connected to the first electrode layer of another sub-cell, such that the plurality of sub-cells are electrically connected, wherein a thickness of the main body portion is greater than that of the part of the connection portion formed on the surface of the first electrode layer facing away from the substrate in the hollow-out portion;

a ratio of the thickness of the main body portion to that of the connection portion is denoted by A, and $1 < A \leq 10$;

each of the plurality of sub-cells comprises a barrier layer for blocking transport of first charges, and the barrier layer is disposed between the photovoltaic conversion module and the main body portion;

a ratio of a thickness of the barrier layer to that of the main body portion is denoted by C, and $0.01 \leq C \leq 0.2$; and the second electrode layer comprises a first material and a second material, the first material is provided on a side of the photovoltaic conversion module that faces away from the first electrode layer to form a first film layer, the second material is provided in the hollowed-out portion and a side of the first film layer that faces away from the first electrode layer to form a second film layer, and the first material is different from the second material.

2. The solar cell according to claim 1, wherein
the main body portions are made of the same material; and
optionally, the material of the main body portion comprises aurum (Au), argentum (Ag), cuprum (Cu), aluminum (Al), a transparent conductive oxide (TCO), or carbon.

3. The solar cell according to claim 1, wherein
a ratio of a weight of the barrier layer to that of the main body portion is denoted by B, and $0.001 \leq B \leq 0.2$.

4. The solar cell according to claim 1, wherein
the photovoltaic conversion module comprises a first charge transport layer, a photovoltaic conversion layer, and a second charge transport layer that are sequentially stacked along the thickness direction of the sub-cell, and the first charge transport layer is located between the first electrode layer and the photovoltaic conversion layer; and wherein the material of the first charge transport layer comprises at least one of poly [bis (4-phenyl)(2,4,6-trimethylphenyl) amine (PTAA), poly(3,4-ethylenedioxythiophene)(PEDOT), nickel oxide (NiOx), CuI, and $Cu_2O$; and/or the material of the photovoltaic conversion layer conforms to the $ABX_3$ crystal structure, wherein A comprises at least one of methylammonium (MA), formamide (FA), and cesium (Cs), B comprises at least one of plumbum (Pb), stannum (Sn), and cuprum (Cu), and X comprises at least one of bromine (Br), chlorine (CI), and iodine (I); and/or the material of the second charge transport layer comprises at least one of C60, stannic oxide ($SnO_2$), a fullerene derivative, and titanium oxide ($TiO_2$).

5. The solar cell according to claim 1, wherein
the material of the first electrode layer comprises aurum (Au), argentum (Ag), cuprum (Cu), aluminum (Al), a transparent conductive oxide (TCO), or carbon.

6. A photovoltaic module comprising a plurality of solar cells according to claim 1.

7. A power consuming device comprising the photovoltaic module according to claim 6, the photovoltaic module being configured to provide electrical energy.

* * * * *